(12) United States Patent
Steffen

(10) Patent No.: US 10,885,771 B2
(45) Date of Patent: Jan. 5, 2021

(54) METHOD FOR DETERMINING THRESHOLDS OF A STATE MONITORING UNIT FOR A FIRE DETECTION AND/OR EXTINGUISHING CONTROL CENTER, STATE MONITORING UNIT, AND SYSTEM COMPRISING SAME

(71) Applicant: MINIMAX GMBH & CO. KG, Bad Oldesloe (DE)

(72) Inventor: Hartwig Steffen, Reinbek (DE)

(73) Assignee: Minimax GmbH & Co. KG, Bad Oldesloe (DE)

( * ) Notice: Subject to any disclaimer, the term of this patent is extended or adjusted under 35 U.S.C. 154(b) by 334 days.

(21) Appl. No.: 15/778,139

(22) PCT Filed: Nov. 15, 2016

(86) PCT No.: PCT/EP2016/077776
§ 371 (c)(1),
(2) Date: May 22, 2018

(87) PCT Pub. No.: WO2017/089185
PCT Pub. Date: Jun. 1, 2017

(65) Prior Publication Data
US 2018/0342150 A1    Nov. 29, 2018

(30) Foreign Application Priority Data
Nov. 25, 2015  (DE) ........................ 10 2015 223 253

(51) Int. Cl.
*G08B 29/14*    (2006.01)
*G08B 29/26*    (2006.01)
(Continued)

(52) U.S. Cl.
CPC ....... *G08B 29/145* (2013.01); *G01R 31/2829* (2013.01); *G08B 13/00* (2013.01);
(Continued)

(58) Field of Classification Search
CPC ...... G08B 29/145; G08B 29/26; G08B 13/00; G08B 17/00; G08B 17/10; G08B 25/018;
(Continued)

(56) References Cited

U.S. PATENT DOCUMENTS 5,172,096 A * 12/1992 Tice ..................... G08B 17/00
340/501
5,612,674 A    3/1997 Tice
(Continued)

FOREIGN PATENT DOCUMENTS

CN    128882    8/1996
CN    1885007 A    12/2006
(Continued)

OTHER PUBLICATIONS

International Searching Authority, International Search Report in German & English translation in International Appln. No. PCT/EP2016/077776, dated Feb. 24, 2017, 7 pages.
(Continued)

*Primary Examiner* — Manuel L Barbee
(74) *Attorney, Agent, or Firm* — Perkins Coie LLP

(57) ABSTRACT

The invention relates to a condition monitoring unit for a fire detection and/or extinguishing control unit. The condition monitoring unit comprises at least one current circuit connection for connecting the condition monitoring unit to at least one current circuit, wherein the current circuit has at least one participant which detects an event. The condition monitoring unit further comprises a measuring device for measuring values of currents and/or voltages at the current circuit connection and an analysis unit in which one or more threshold values can be stored. The analysis unit is designed to detect, in an operating mode at least, an event in which values of currents and/or voltages measured by the measuring device exceed or fall below the at least threshold value.

(Continued)

The condition monitoring unit further comprises a memory unit or an interface for transmitting data to an external memory unit, wherein the condition monitoring unit is designed to store values of the currents and/or voltages measured by the measuring device in the memory unit, in a learning mode at least, or to output the values via the interface to the external memory unit and to determine or change the threshold values depending on the stored values of the currents and/or voltages.

The invention also relates to a method for determining threshold values for a condition monitoring unit for a fire detection and/or extinguishing control unit, to a fire detection and/or extinguishing control unit and to a fire detection system.

14 Claims, 2 Drawing Sheets

(51) Int. Cl.
*G08B 17/10* (2006.01)
*G08B 17/00* (2006.01)
*G08B 25/01* (2006.01)
*G08B 25/14* (2006.01)
*G08B 25/04* (2006.01)
*G08B 26/00* (2006.01)
*G08B 13/00* (2006.01)
*G01R 31/28* (2006.01)

(52) U.S. Cl.
CPC ............. *G08B 17/00* (2013.01); *G08B 17/10* (2013.01); *G08B 25/018* (2013.01); *G08B 25/04* (2013.01); *G08B 25/14* (2013.01); *G08B 26/006* (2013.01); *G08B 29/26* (2013.01)

(58) Field of Classification Search
CPC ...... G08B 25/04; G08B 25/14; G08B 26/006; G01R 31/2829
See application file for complete search history.

(56) References Cited

U.S. PATENT DOCUMENTS

| | | | | |
|---|---|---|---|---|
| 2010/0085199 | A1* | 4/2010 | Gonzales | G08B 29/043 340/629 |
| 2014/0015680 | A1* | 1/2014 | Chandler | G08B 29/26 340/630 |
| 2016/0127878 | A1* | 5/2016 | Clarke | H04W 4/021 705/324 |

FOREIGN PATENT DOCUMENTS

| | | |
|---|---|---|
| CN | 101027648 A | 8/2007 |
| CN | 101529355 A | 9/2009 |
| CN | 102538859 A | 7/2012 |
| CN | 203232549 U | 10/2013 |
| CN | 103578216 A | 2/2014 |
| CN | 103776654 A | 5/2014 |
| CN | 104212872 A | 12/2014 |
| CN | 104914850 A | 9/2015 |
| CN | 105045253 A | 11/2015 |
| DE | 3127324 | 1/1983 |
| DE | 3523232 | 1/1986 |
| DE | 10 2005 035409 | 2/2007 |
| EP | 0526898 | 2/1993 |
| EP | 2402832 | 1/2012 |
| GB | 2 161 966 | 3/1988 |
| JP | 3933400 B | 6/2007 |
| JP | 2015-094624 A | 5/2015 |
| JP | 2015-197787 A | 11/2015 |
| WO | WO 2010/122971 A1 | 10/2010 |

OTHER PUBLICATIONS

Chinese Patent Office, Office Action issued in Chinese Patent Application No. 201680068971.7 with English translation, dated Jul. 24, 2019, 24 pages.

Office Action with translation, Eurasian Application No. 201891247, 4 pages (dated Nov. 12, 2019).

Second Office Action (with English translation), Chinese Application No. 201680068971.7, 10 pages (dated May 18, 2020).

* cited by examiner

METHOD FOR DETERMINING THRESHOLDS OF A STATE MONITORING UNIT FOR A FIRE DETECTION AND/OR EXTINGUISHING CONTROL CENTER, STATE MONITORING UNIT, AND SYSTEM COMPRISING SAME

PRIORITY CLAIM AND INCORPORATION BY REFERENCE

This application is a 35 U.S.C. § 371 application of International Application No. PCT/EP2016/077776, filed Nov. 15, 2016, which claims the benefit of German Application No. 10 2015 223 253.0, filed Nov. 25, 2015, each of which is incorporated by reference in its entirety.

TECHNICAL FIELD

The invention relates to the field of fire detection and/or extinguishing control units which are connected to a current circuit based on limit value technology, wherein a plurality of participants are connected to the fire detection and/or extinguishing control unit via the current circuit.

BACKGROUND AND SUMMARY OF THE INVENTION

The participants are used to detect an event such as a fire, or changes in the switch positions of components in fire-extinguishing systems. To that end, the participants have sensors, for example, which in the simplest case comprise a switch with which an event can be detected, depending on the type of application. When an event is detected, this is communicated to the fire detection and/or extinguishing control unit via the current circuits based on limit value technology.

Current circuits based on limit value technology are generally known from the prior art and are also referred to as limit monitor circuits or current increase circuits.

In known current circuits based on limit value technology, a predefined constant voltage of 9 V, for example, is provided by the fire detection and/or extinguishing control unit, for example, so that events are reported. The current circuit includes, for example, a two-wire circuit in which a constant voltage is applied on the one side to the two lines by the fire detection and/or extinguishing control unit. On the other side of the two-wire circuit, the two lines are connected to each other across a terminating resistor. Due to the terminating resistor, a predefined, substantially constant current flows through the current circuit.

Several participants are also connected, for example in parallel to the terminating resistor, each participant having a current sink such as a switchable internal resistor, and if an event occurs, this internal resistor is connected in such a way to the current circuit that the total current measured by the fire detection and/or extinguishing control unit at the current circuit input is increased.

By detecting these current increases in the fire detection and/or extinguishing control unit, it is now possible to infer that an event has occurred, so it possible for the fire detection and/or extinguishing control unit to respond to it appropriately.

Other participants besides those already mentioned are also known, which have complex microprocessor systems and which require electrical energy themselves in order to operate and to supply these microprocessor systems with power. The microprocessors need energy for a short period, for example, before returning to a sleep mode. Fluctuations in the current circuit then occur because of such participants. Besides the latter participants, there are also other known participants which have a constant current source or a constant current sink instead of a fixed resistor, for signalling an alarm. All the aforementioned participants may also be mixed in a current circuit, which means they are used in a current increase circuit.

Threshold values must therefore be set individually for each fire detection and/or extinguishing control unit, depending on their structure, and these threshold values allow the fire detection and/or extinguishing control unit to distinguish between a detected event and normal standby operation.

Distinguishing the possible conditions in an optimal manner is thus dependent on many factors. Attempts are made to minimise interference from various kinds of electronic circuit, such as low-pass filters, but variations in current in the order of milliamperes are nevertheless to be expected when the condition is unchanging.

For that reason, a complicated process of setting the threshold values must be carried out after installing the fire detection and/or extinguishing control unit, the current circuit and the participants. These values are derived individually, depending on the number of detectors, the length and condition of the circuit lines, and any temperature variations that are present.

Dimensioning the threshold values arithmetically is not a safe solution for distinguishing events reliably. In many cases, namely, neither the exact lengths of the circuit lines, nor the temperature range to which specific parts of the circuit lines are exposed are known. The alarm resistors and the current sinks also have certain degrees of tolerance and even dependencies on temperature. Although there is some experience in setting the threshold values, that experience cannot be transferred to every situation.

The object of the present invention is therefore to find a simplified way of setting threshold values for current circuits based on limit value technology, which allow a reliable distinction to be made between different conditions (standby, event) of the fire detection and/or extinguishing control unit.

According to the invention, a condition monitoring unit for a fire detection and/or extinguishing control unit is therefore proposed which comprises at least one current circuit connection for connecting the condition monitoring unit to at least one current circuit. The current circuit has at least one participant to detect events.

The condition monitoring unit further comprises a measuring device for measuring values of currents and/or voltages at the current circuit connection. An analysis unit in which one or more threshold values can be stored is also provided in the condition monitoring unit.

The analysis unit is further designed to detect, in an operating mode at least, an event in which values of currents and/or voltages measured by the measuring device exceed or fall below the at least one threshold value.

The condition monitoring unit also comprises a memory unit or an interface for transmitting data to an external memory.

The condition monitoring unit is designed to store values of the currents and/or voltages measured by the measuring device in the memory unit, in a learning mode at least, or to output the values via the interface to the external memory unit and to determine or change the threshold values depending on the stored values of the currents and/or voltages.

A learning mode is thus provided in which values of the currents and/or voltages are continuously recorded during a period in which the condition monitoring unit is in said learning mode. Continuous recording is preferably to be understood as recording several values at intervals over a particular period, e.g. with a predefined frequency or sampling rate.

Tests are thus conducted to determine which values the currents and/or voltages adopt, so that one or more threshold values are determined, or changed if they have already been determined, depending on said currents and/or voltages.

According to a first embodiment, the condition monitoring unit is designed to determine a frequency distribution of the measured values of the currents and/or voltages in order to determine or change the threshold value(s) depending on the stored values of the currents and/or voltages. The condition monitoring unit is also designed to select, for the threshold value(s), those values of the currents and/or voltages which correspond respectively to a minimum in the frequency distribution and/or which correspond respectively to a mean value between adjacent maxima in the frequency distribution.

Thus, in the learning mode, the values of the currents and/or voltages are recorded and a frequency distribution is determined for those currents and/or voltages. In order to now determine the threshold values, values of the currents and/or voltages are selected which represent a minimum in the frequency distribution or which correspond to a mean value between adjacent maxima in the frequency distribution.

Values of the currents and/or voltages that are normally suitable for use as threshold values and for distinguishing between currents and/or voltages that frequently occur, can thus be determined in a simple manner. Frequently occurring values of the currents and/or voltages can be generated, for example, by one, all or a plurality of participants being manually triggered in succession or in different orders in the learning mode. This can be during a normal audit procedure, for example, in which the fire detection and/or extinguishing control unit is tested at regular intervals to ensure that it is working properly.

According to another embodiment, the learning mode comprises a first subordinate mode which is designed to detect a quiescent value by determining a maximum in the frequency distribution of all the values of the currents and/or voltages measured in the first subordinate mode. In addition or alternatively, the learning mode comprises a second subordinate mode which is designed to detect a first event value by determining a maximum in the frequency distribution of all the values of the currents and/or voltages measured in the second subordinate mode.

According to this embodiment, the learning mode additionally or alternatively comprises a third subordinate mode which is designed to detect a second event value by determining a maximum in the frequency distribution of all the values of the currents and/or voltages recorded in the third subordinate mode.

A quiescent value is thus determined in a first subordinate mode, a first event value in a second subordinate mode and/or a second event value in a third subordinate mode.

To determine the values, the condition module is put into the learning mode in the first subordinate mode, for example, after the entire fire detection and/or extinguishing control unit has been installed with all its participants and with the current circuit. Different conditions, such as temperatures or other factors affecting the fire detection and/or extinguishing control unit, and which influence the quiescent value are now varied. A frequency distribution is thus determined for the duration of the first subordinate mode, and the maximum in that frequency distribution is specified as the quiescent value.

In the second subordinate mode, several participants are then triggered separately and singly, one after the other. In this case also, it is possible for additional parameters, such as the ambient temperature or other factors, to be varied. A frequency distribution is then determined for the period of the second subordinate mode also, and the maximum is specified as a first event value.

In the third subordinate mode, at least two participants are always triggered separately, one after the other, with variation in which two participants are triggered. A frequency distribution is determined for this third subordinate mode also, and the maximum is specified as a second event value.

The histograms or frequency distributions are calculated on the basis of the values of the currents and/or voltages measured in the respective mode.

Various current and/or voltage values which are representative either of a quiescent condition or of a first or second event condition can thus be detected in a simple manner. Threshold values can therefore be determined in a simple manner on the basis of the determined values, namely the quiescent value, the first event value and/or the second event value.

According to another embodiment, the condition monitoring unit is further designed to determine a first threshold value equal to an arithmetical mean of the quiescent value and the first event value. The condition monitoring unit according to this embodiment is designed, additionally or alternatively, to determine a second threshold value equal to an arithmetical mean of the first event value and the second event value.

Particularly suitable threshold values are thus determined by selecting threshold values which are as far away as possible from the particular values that signal different states.

According to another embodiment, the condition monitoring unit includes a test mode for testing whether all the values of the currents and/or voltages measured in the first subordinate mode are below the first threshold value and/or whether all the values of the currents and/or voltages measured in the second subordinate mode are above the first threshold value.

The testing mode is used, alternatively or additionally, to determine whether all the values of the currents and/or voltages measured in the second subordinate mode are below the second threshold value and/or whether all the values of the currents and/or voltages measured in the third subordinate mode are above the second threshold value.

After selecting the threshold values, tests are therefore carried out to determine whether those values have actually been specified such that the values corresponding to the threshold values do not indicate an event or a quiescent condition, but are distant from values which indicate a particular condition.

According to another embodiment, the condition monitoring unit is also designed to store in the memory unit, also in the operating mode, values of the currents and/or voltages which are measured at intervals or continuously and/or to output the values via the interface to the external memory unit. The condition monitoring unit is also designed to determine or change the threshold values automatically during the operating mode and/or, in response to a manual request in the operating mode or the learning mode, to determine or change the values measured at intervals or continuously in the operating mode.

The threshold values can thus be automatically readjusted. It is also possible, in a maintenance interval, for example, after the fire detection and/or extinguishing control unit with the condition monitoring unit has already been in operation for some time, for the threshold value(s) to be readjusted following a manual request by a person performing the maintenance work.

According to another embodiment, the condition monitoring unit is designed to display, for the user, the threshold value(s) calculated for the purpose of determining or changing, in response to a manual request from a user to determine or change the threshold value(s), or to output them via an interface for display, for example on a display device. The condition monitoring unit is designed, additionally or alternatively, to receive user commands via the interface or input means. Depending on the commands, this is used to change one or more stored threshold values by replacing them with the calculated threshold values, to delete one, all or a plurality of the threshold value(s) and/or the stored values of the currents and/or voltages, and/or to switch between the modes.

It is thus possible, therefore, for a user to check the threshold value(s) calculated, for example visually on a display, before one, all or a plurality of threshold values are determined or changed. By means of the input means, the user can also select the individual modes, for example to select the learning mode, the first, second and/or third subordinate mode or the test mode.

According to one embodiment, the condition monitoring unit is designed to be used as a module in a fire detection and/or extinguishing control unit. The condition monitoring unit is designed alternatively as an integrated module of the fire detection and/or extinguishing control unit.

The invention further comprises a method for determining threshold values for a condition monitoring unit for a fire detection and/or extinguishing control unit according to any one of the aforementioned embodiments. The invention also includes a fire detection and/or extinguishing control unit comprising a condition monitoring unit according to any one of the aforementioned embodiments, in particular for carrying out the method.

The invention also includes a fire detection system comprising a fire detection and/or extinguishing control unit having a condition monitoring unit according to any one of said embodiments, comprising a current circuit and a plurality of participants, in particular for carrying out the method.

BRIEF DESCRIPTION OF THE DRAWINGS

Other embodiments are derived from the embodiments that are described in detail with reference to the drawings. In the drawings.

MODE(S) FOR CARRYING OUT THE INVENTION

Figure 1:
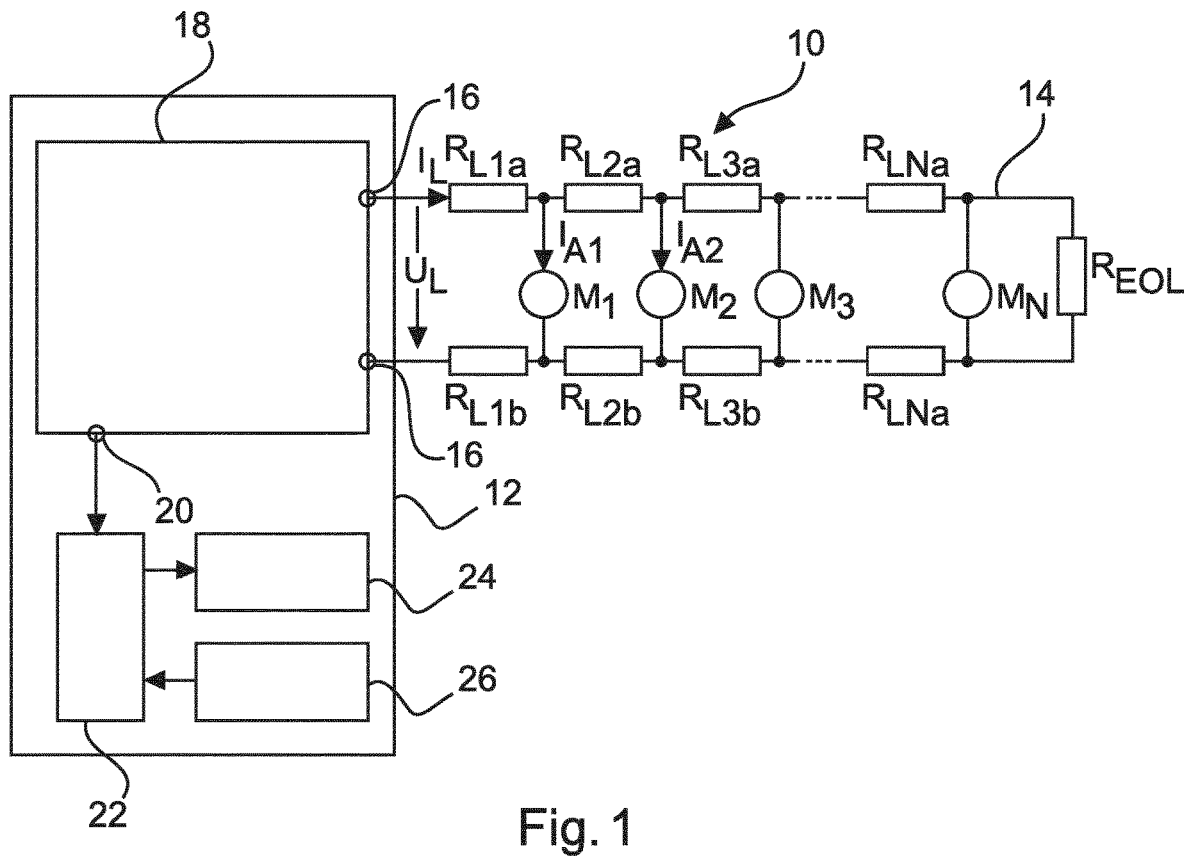
FIG. 1 shows an embodiment of a fire detection system.

FIG. 1 shows a fire detection system 10 comprising a fire detection and/or extinguishing control unit 12. Fire detection system 10 further comprises a current circuit 14 which includes a two-wire circuit, wherein the lines of the two-wire circuit are connected to each other at one end across a terminating resistor REOL. At the another end, the lines of the two-wire circuit are connected by a current circuit connection 16 to a condition monitoring unit 18.

The condition monitoring unit 18 is a separate unit, for example, e.g. a module, and is provided, in particular, in the form of a top hat rail module which can be snapped onto a top hat rail of the fire detection and/or extinguishing control unit 12. The condition monitoring unit 18 is connected by a bus system interface via an internal bus to a superordinate processor unit 22 by means of an interface 20. The bus system interface is preferably mounted on the housing of the top hat rail module that includes the condition monitoring unit 18.

In one advantageous embodiment, the condition monitoring unit 18 comprises at least one electronic flat module, or some other integration of electronic components, for example a system-on-chip which includes all the electronic components and modules that are necessary for the condition monitoring unit 18 to function. The electronic components will be described in detail further below with reference to FIG. 2.

An interface 20 and a superordinate processor unit 22 are also provided. The superordinate processor unit 22 is not part of the condition monitoring unit 18, but is merely connected via the interface to the condition monitoring unit 18. A display device 24 is also connected to the superordinate processor unit 22. Input means 26 with which user commands can be inputted via interface 20 to the condition monitoring unit 18 by means of the superordinate processor unit 22 are also provided. Input means 26 are also used, for example, to configure the fire detection and/or extinguishing control unit 12. Display device 24 is used to display the configuration and to display the operating mode of the fire detection and/or extinguishing control unit 12, or the different modes that are selected by means of input means 26.

Current circuit 14, which is connected via the current circuit connection 16 to the condition monitoring unit 18, is connected to participants M1ccMN. The participants are thus connected in parallel to terminating resistor REOL. Resistors RL1a-RLNa and RL1b-RLNb are the line resistances between the individual participants M1-MN. Each participant M1-MN has an energy sink (not shown) and an element (not shown) for detecting events. This element is a sensor, for example, which detects fire parameters such as temperature, smoke aerosols, electromagnetic radiation from flames, sparks or pockets of embers or fire gases, or a simple switch that registers changes in the switch positions of components in fire-extinguishing systems, for example in valve positioning monitoring where the switch is opened or closed by the valve opening or closing, in order to detect an event in this way.

The participants are thus used for various different purposes within the fire detection system, for example as:
  limit switches for detecting the position of ball valves, shut-off valves, shut-off flaps or slides;
  manometric switches for measuring air pressure, e.g. in compressed air water containers or in the dry pipe network;
  float switches for measuring filling levels in compressed air water container, unpressurised water containers and other vessels for storing extinguisher fluid;
  temperature switches, for example for monitoring the ambient temperature in a sprinkler station;

pump pressure switches for starting the sprinkler pump motor in response to a pressure drop in the pipe network for extinguisher fluid, or in a tap;

fire alarms, such as automatic fire alarms or manual call points, and sensors for registering event alarms, fire alarms and malfunctions.

Customary standards allow up to 32 participants M1-MN to be used on a current increase circuit, namely current circuit 14. They may be placed anywhere in the current increase circuit, that is in current circuit 14, which is designed here as a two-wire circuit. In the simplest case, participants M1-MN may be provided in the form of a switch and a resistor connected in series, for example a 470Ω resistor. When the switch is closed in the case of an alarm, this causes an increase in current, for example an increase of 18 mA, which can be detected by the condition monitoring unit 18.

Applicable standards propose methods for preventing false alarms. One method expects there to be at least two simultaneously triggered participants M1-MN. In this case, a current ensues which is arithmetically higher than when only one participant is triggered. A current of 41 mA is possible here, for example.

Resistors RL1a-RLNa and RL1b-RLNb are not taken into account in the latter current values. When they are taken into account, the currents measured by the condition monitoring unit 18 also depend on whether the two participants M1-MN which detect an event are located at the start of current circuit 14, i.e. near condition monitoring unit 18, or at the end, i.e. near terminating resistor REOL.

Besides the alarms or events in which one or more participants M1-MN are in the alarm condition, i.e. have detected an event, the condition monitoring unit 18 must also detect disturbances in current circuit 14. If the current drops far below the quiescent current, which is 5 mA for example, then this is an indication that current circuit 14 has been interrupted. If the current increases to higher levels, the condition monitoring unit 18 can assume that there is a short circuit in current circuit 14.

The condition monitoring unit 18 therefore serves to detect events by providing a substantially constant line voltage UL for current circuit 14. A normal voltage level is around 9 V, although levels of up to 24 V are common. Terminating resistor REOL has an impedance of 1.8 kΩ, for example.

The conducting wires of current circuit 14 have a cross-section of 0.8 mm², for example, and therefore have a resistance of approximately 4Ω per 100 m length at 20°. That resistance is not constant, however, but can vary with temperature. In the case of the aforementioned wire cross-section, the resistance varies by more than 50 mΩ over a loop length of 100 m and a temperature difference of 10°. In practice, cable paths are up to 1,000 m long in many cases. The current IL flowing through current circuit 14 is therefore measured by the condition monitoring unit and varies according to temperature, for example, as noted above.

Figure 2:
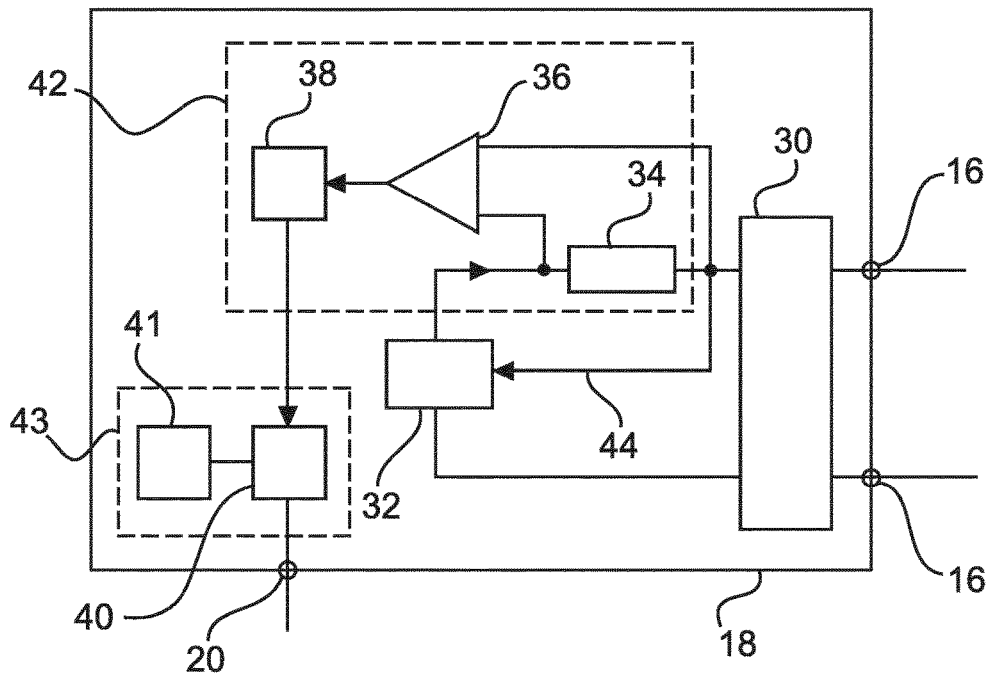
FIG. 2 shows an enlarged view of an embodiment of a condition monitoring unit.

FIG. 2 shows the detailed structure of a condition monitoring unit 18. The condition monitoring unit 18 has a current circuit connection 16 which is connected to a signal processor 30. Signal processor 30 contains filters, for example, for smoothing the voltages and currents in current circuit 14.

A voltage source 32 is also provided, by means of which a voltage, for example of 9 V, can be applied to current circuit connection 16. A shunt resistor 34 is also provided between voltage source 32 and current circuit connection 16. This resistor is used for measuring current. When a current flows through current circuit 14, which is connected at current circuit connection 16, there is a drop in voltage across shunt resistor 34. This drop in voltage is sensed with the aid of a current measurement stage 36 and supplied to an analogue/digital converter 38 of a processor unit 40. Shunt resistor 34, current measurement stage 36 and A/D converter 38 form a measuring device 42.

As a voltage drops across shunt resistor 34, a feedback line 44 is provided to readjust voltage source 32 so that a substantially constant voltage is applied at the current circuit connection 16. Processor unit 40 is connected to a memory unit 41. Processor unit 40 and memory unit 41 form an analysis unit 43. In a learning mode, analysis unit 43 is used to store currents IL measured by measuring device 42. The values of currents IL through current circuit 14, which are measured in the learning mode by means of measuring device 42, are stored in the memory unit 41 of analysis unit 43.

By means of measuring device 42, it is thus possible to measure different current values which occur when an event is detected by a participant M1-MN, or when no event is detected.

Threshold values are calculated, depending on the values that are stored. These threshold values are used later to distinguish between different currents in the current circuit, namely a quiescent current at which no participant M1-MN has detected an event, a first event value at which a single participant has detected an event, and a second event value at which at least two participants M1-MN have detected an event.

Figure 3:
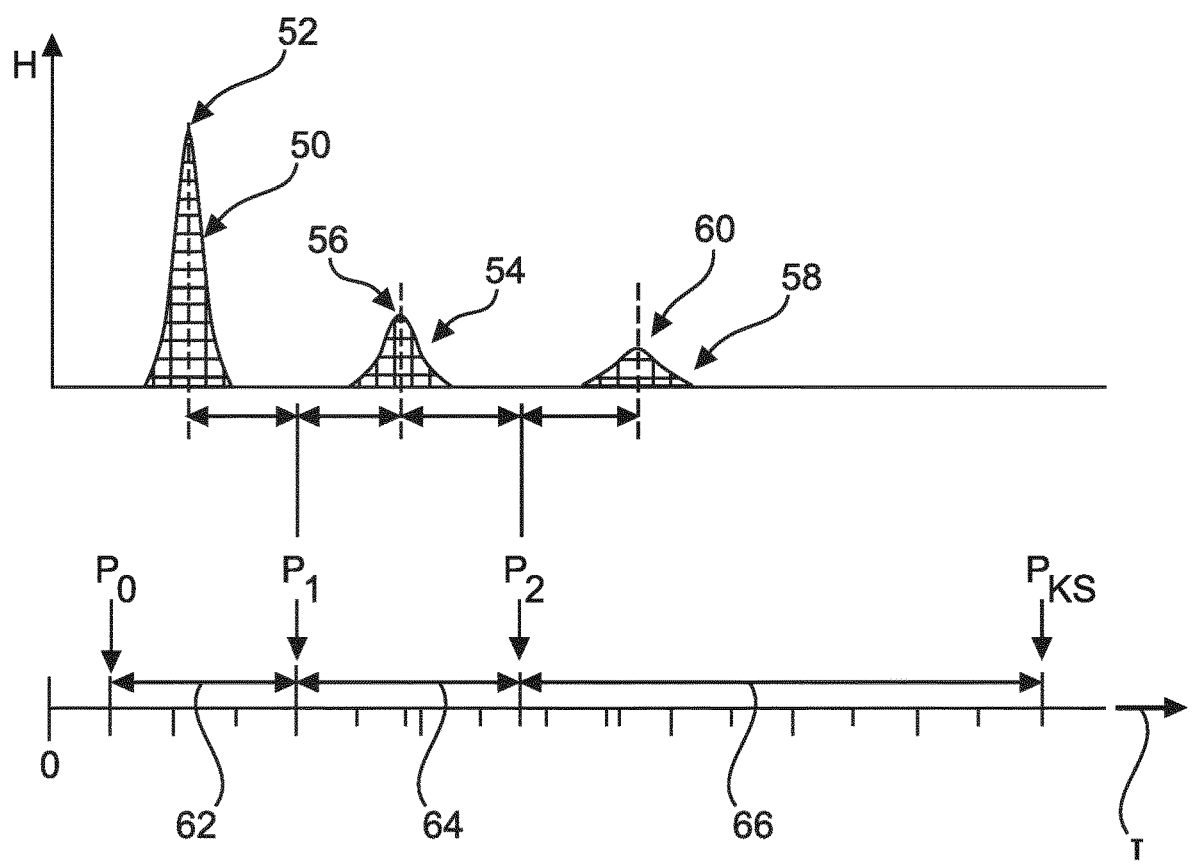
FIG. 3 shows a measured frequency distribution and the determination of values and threshold values.

It shall now be described in detail how the threshold values are determined by analysis unit 43. Reference is made in this regard to FIG. 3.

In the first step, a first threshold value P1 is determined.

To do so, the frequency distribution 50 of a quiescent value IR is determined, in a learning mode, by recording values of current IL in a first subordinate mode by means of the analysis unit 43 of condition monitoring unit 18. The duration of such recording, i.e. the period for which the measured values are stored, can be either a predefined or an arbitrary duration, for example from installation to entry into service of the fire detection and/or extinguishing control unit 12. Frequency distribution 50 is used to calculate a maximum 52, which is then defined as quiescent value IR.

In the step that follows, in a second subordinate mode, all the participants M1-MN connected to current circuit 14 are individually put into the alarm condition, i.e. in such a way that they detect an event. Current values IL are measured again and stored in memory unit 41. Frequency distribution 54 is then determined in the basis of those values. Frequency distribution 54 is likewise used to calculate maximum 56, which is then defined as the first event value IE1. The arithmetic mean of quiescent value IR and the first event value IE1 is then determined. That mean is defined as the first threshold value P1.

In a test mode, tests are then performed to determine whether all the values measured in the first subordinate mode are below P1 and all the values measured in the second subordinate mode are above P1. If that is not the case, an error message is outputted by analysis unit 43.

A second threshold value P2 is also determined, in a third subordinate mode, by successively triggering two participants M1-MN simultaneously. At least the two participants M1-MN which are closest to the fire detection and/or extinguishing control unit 12 in current circuit 14 are triggered, as well as the two participants M1-MN which are closest to terminating resistor REOL in current circuit 14.

Other combinations thereof are likewise advantageous. These values are then used to generate another frequency distribution 58 based on the values stored in the third subordinate mode, and a maximum 60 is also determined on the basis of that frequency distribution 58. This maximum 60 is then defined as the second event value IE2.

In the next step, threshold value P2 is calculated as the arithmetic mean between the first event value IE1, the one determined in the second subordinate mode, and the second event value IE2, the one determined in the third subordinate mode. Processor unit 40 again checks whether all the values measured in the second subordinate mode are below the second threshold value P2 and all the values measured in the third subordinate mode are above the second threshold value P2. In the event of any error, this is signalled accordingly.

Ranges 62 to 66 are thus defined. These ranges correspond to ranges of current values to be assigned to different events. Ranges 62 to 66 are separated from each other by threshold values P1 and P2. In range 62, for example, it is assumed that no event has occurred and that a quiescent condition is present. In range 64, it is then assumed that an event detected by a participant M1-MN has occurred. The adjoining range 66 is then a range of current values in which at least two participants M1-MN have triggered.

Threshold values P0 and PKS are also entered. If a current below the value P0 is detected by measuring device 42, there is a broken wire. If a value above threshold value PKS is measured, a short-circuit is assumed. Values P0 and PKS are permanently preset, for example, in memory unit 41.

Threshold values P1 and P2 for distinguishing between a quiescent condition or an event condition can thus be determine in a simple and particularly precise and reliable manner and can be stored in memory unit 41 once they have been determined.

LIST OF UTILIZED REFERENCE NUMBERS

10 Fire detection system
12 Fire detection and/or extinguishing control unit
14 Current circuit
$R_{EOL}$ Terminating resistor
16 Current circuit connection
18 Condition monitoring unit
20 Interface
22 Superordinate processor unit
24 Display device
26 Input means
$M_1$-$M_N$ Participants
$R_{L1a}$-$R_{LNa}$ $R_{L1b}$-$R_{LNb}$ Resistors
$I_L$ Current
30 Signal processor
32 Voltage source
34 Shunt resistor
36 Current measurement stage
38 Analogue/digital converter
40 Computer unit
41 Memory unit
42 Measuring device
43 Analysis unit
44 Feedback line
$P_1$ First threshold value
$P_2$ Second threshold value
$I_{E1}$ First event value
$I_{E2}$ Second event value
50, 54, 58 Frequency distribution
52, 56, 60 Maximum
$I_R$ Quiescent value
62-66 Ranges
$P_0$, $P_{KS}$ Threshold values

The invention claimed is:

1. A condition monitoring unit for a fire detection and/or extinguishing control unit, comprising:
at least one current circuit connection for connecting the condition monitoring unit to at least one current circuit, wherein the current circuit has at least one participant which detects an event,
a measuring device for measuring values of currents and/or voltages at the current circuit connection,
an analysis unit in which one or more threshold values can be stored, wherein the analysis unit is designed to detect, in an operating mode at least, an event in which values of currents and/or voltages measured by the measuring device exceed or fall below the at least one threshold value, and
a memory unit or an interface for transmitting data to an external memory unit, wherein the condition monitoring unit is designed to store values of the currents and/or voltages measured by the measuring device in the memory unit, in a learning mode at least, or to output the values via the interface to the external memory unit and to determine or change the threshold values depending on the stored values of the currents and/or voltages to determine a frequency distribution of the measured values of the currents and/or voltages and to select for threshold values those values of the currents and/or voltages which correspond respectively to a minimum in the frequency distribution and/or which correspond respectively to a mean value between adjacent maxima in the frequency distribution.

2. The condition monitoring unit according to claim 1, wherein the learning mode further comprises:
a first subordinate mode which is designed to detect a quiescent value by determining a maximum in the frequency distribution of all the values of the currents and/or voltages measured in the first subordinate mode and/or
a second subordinate mode which is designed to detect a first event value by determining a maximum in the frequency distribution of all values of the currents and/or voltages measured in the second subordinate mode, and/or
a third subordinate mode which is designed to detect a second event value by determining a maximum in the frequency distribution of all the values of the currents and/or voltages recorded in the third subordinate mode.

3. The condition monitoring unit according to claim 2, wherein the condition monitoring unit is designed
to determine a first threshold value equal to an arithmetical mean of the quiescent value and the first event value and/or
to determine a second threshold value equal to an arithmetical mean of the first event value and the second event value.

4. The condition monitoring unit according to claim 3, wherein the condition monitoring unit includes a test mode for testing whether
all the values of the currents and/or voltages measured in the first subordinate mode are below the first threshold value and/or all the values of the currents and/or voltages measured in the second subordinate mode are above the first threshold value and/or
all the values of the currents and/or voltages measured in the second subordinate mode are below the second threshold value and/or all the values of the currents and/or voltages measured in the third subordinate mode are above the second threshold value.

5. The condition monitoring unit according to claim 1, wherein the condition monitoring unit is designed to store, in the memory unit, values of the currents and/or voltages which are measured at intervals or continuously in the operating mode and/or to output the values via the interface to the external memory unit and to determine or change the threshold value(s) automatically during the operating mode and/or to allow the user to determine or change the values measured at intervals or continuously, when manually requested in the operating mode or in the learning mode.

6. The condition monitoring unit according to claim 1, wherein the condition monitoring unit is designed to display, for the user, the threshold value(s) calculated for the purpose of determining or changing, when manually requested by a user to determine or change the threshold value(s), or to output them via an interface for display, for example on a display device, and/or
to receive user commands via the interface or input means in order, depending on the commands, to change one or more stored threshold values by replacing them with the calculated threshold value(s), to delete one, all or a plurality of the threshold value(s) and/or the stored values of the currents and/or voltages, and/or to switch between the modes.

7. A method for determining at least one threshold value for a condition monitoring unit for a fire detection and/or extinguishing control unit, comprising:
measuring with a measuring device values of currents and/or voltages of at least one current circuit connection of the condition monitoring unit,
detecting by an analysis unit, in an operating mode at least, an event in which the values of currents and/or voltages measured by the measuring device exceed or fall below the at least one threshold value wherein
storing in a memory unit the measured values of the currents and/or voltages, in a learning mode at least, or outputting the values via an interface to an external memory,
determining or changing at least one threshold value depending on the stored values of the currents and/or voltages, and
determining a frequency distribution of the measured values of the currents and/or voltages in order to determine or change the threshold values depending on the stored values of the currents and/or voltages, and
selecting as the threshold value(s) the values of the currents and/or voltages which correspond respectively to a minimum in the frequency distribution and/or which correspond respectively to a mean value between adjacent maxima in the frequency distribution.

8. The method according to claim 7, wherein
in a first subordinate mode of the learning mode, a quiescent value is detected by determining a maximum in the frequency distribution of all the values of the currents and/or voltages measured in the first subordinate mode and/or
in a second subordinate mode of the learning mode, a first event value is detected by determining a maximum in the frequency distribution of all the values of the currents and/or voltages measured in the second subordinate mode, and/or
in a third subordinate mode of the learning mode, a second event value is detected by determining a maximum in the frequency distribution of all the values of the currents and/or voltages measured in the third subordinate mode.

9. The method according to claim 8, wherein a first threshold value is determined which is equal to an arithmetical mean of the quiescent value and the first event value and/or a second threshold value is determined which is equal to an arithmetical mean of the first event value and the second event value.

10. The method according to claim 9, wherein tests are performed in a test mode to determine whether
all the values of the currents and/or voltages measured in the first subordinate mode are below the first threshold value and/or all the values of the currents and/or voltages measured in the second subordinate mode are above the first threshold value and/or
all the values of the currents and/or voltages measured in the second subordinate mode are below the second threshold value and/or all the values of the currents and/or voltages measured in the third subordinate mode are above the second threshold value.

11. The method according to claim 10, wherein in the operating mode, values of the currents and/or voltages are stored at intervals or continuously in the memory unit, or are automatically outputted via the interface to the external memory unit during operation, and/or are determined or changed by manual request in the operating mode or in the learning mode.

12. The method according to claim 11, wherein
when a user manually requests to determine or change the threshold value(s), the threshold value(s) calculated for the purpose of determining or changing are displayed or outputted via an interface to the display device and/or
user commands are received via the interface or input means in order, depending on the commands, to change one or more stored threshold values by replacing them with the calculated threshold values, to delete one, all or a plurality of the threshold value(s) and/or the stored values of the currents and/or voltages, and/or to switch between the modes.

13. A condition monitoring unit for a fire detection and/or extinguishing control unit, comprising:
at least one current circuit connection for connecting the condition monitoring unit to at least one current circuit, wherein the current circuit has at least one participant which detects an event,
a measuring device for measuring values of currents and/or voltages at the current circuit connection,
an analysis unit in which one or more threshold values can be stored, wherein the analysis unit is designed to detect, in an operating mode at least, an event in which values of currents and/or voltages measured by the measuring device exceed or fall below the at least one threshold value, and
a memory unit or an interface for transmitting data to an external memory unit,
wherein the condition monitoring unit is designed to store values of the currents and/or voltages measured by the measuring device in the memory unit, in a learning mode at least, or to output the values via the interface to the external memory unit and to determine or change the threshold values depending on the stored values of the currents and/or voltages, and
wherein the learning mode further comprises:
a first subordinate mode which is designed to detect a quiescent value by determining a maximum in the frequency distribution of all the values of the currents and/or voltages measured in the first subordinate mode and/or a second subordinate mode which is designed to detect a first event value by determining a maximum in the frequency distribution of all the values of the currents and/or voltages measured in the second subordinate mode, and/or a third subordinate mode which is designed to detect a second event value by determining a maximum in the frequency distribution of all the values of the currents and/or voltages recorded in the third subordinate mode.

14. A method for determining at least one threshold value for a condition monitoring unit for a fire detection and/or extinguishing control unit, comprising:

measuring with a measuring device values of currents and/or voltages of at least one current circuit connection of the condition monitoring unit, detecting by an analysis unit, in an operating mode at least, an event in which the values of currents and/or voltages measured by the measuring device exceed or fall below the at least one threshold value, storing in a memory unit the measured values of the currents and/or voltages, in a learning mode at least, or outputting the values via an interface to an external memory, and determining or changing at least one threshold value depending on the stored values of the currents and/or voltages, wherein in a first subordinate mode of the learning mode, a quiescent value is detected by determining a maximum in the frequency distribution of all the values of the currents and/or voltages measured in the first subordinate mode, and/or wherein in a second subordinate mode of the learning mode, a first event value is detected by determining a maximum in the frequency distribution of all the values of the currents and/or voltages measured in the second subordinate mode, and/or wherein in a third subordinate mode of the learning mode, a second event value is detected by determining a maximum in the frequency distribution of all the values of the currents and/or voltages measured in the third subordinate mode.

* * * * *